United States Patent
Liao et al.

(10) Patent No.: US 11,127,845 B2
(45) Date of Patent: Sep. 21, 2021

(54) ENCLOSED GATE RUNNER FOR ELIMINATING MILLER TURN-ON

(71) Applicant: Delta Electronics, Inc., Taoyuan (TW)

(72) Inventors: Wen-Chia Liao, Taoyuan (TW);
Ying-Chen Liu, Taoyuan (TW);
Chen-Ting Chiang, Taoyuan (TW)

(73) Assignee: DELTA ELECTRONICS, INC., Taoyuan (TW)

(*) Notice: Subject to any disclaimer, the term of this patent is extended or adjusted under 35 U.S.C. 154(b) by 0 days.

(21) Appl. No.: 16/213,081

(22) Filed: Dec. 7, 2018

(65) Prior Publication Data

US 2019/0109221 A1 Apr. 11, 2019

Related U.S. Application Data

(63) Continuation of application No. 15/655,241, filed on Jul. 20, 2017, now Pat. No. 10,680,090.

(51) Int. Cl.
| | |
|---|---|
| *H01L 29/40* | (2006.01) |
| *H01L 29/745* | (2006.01) |
| *H01L 29/749* | (2006.01) |
| *H01L 29/66* | (2006.01) |
| *H01L 29/778* | (2006.01) |
| *H01L 29/20* | (2006.01) |
| *H01L 29/423* | (2006.01) |

(52) U.S. Cl.
CPC ...... *H01L 29/7455* (2013.01); *H01L 29/2003* (2013.01); *H01L 29/402* (2013.01); *H01L 29/404* (2013.01); *H01L 29/405* (2013.01); *H01L 29/42316* (2013.01); *H01L 29/66068* (2013.01); *H01L 29/749* (2013.01); *H01L 29/778* (2013.01)

(58) Field of Classification Search
CPC ................ H01L 29/402–407; H01L 29/404
See application file for complete search history.

(56) References Cited

U.S. PATENT DOCUMENTS

| | | | |
|---|---|---|---|
| 9,899,484 B1* | 2/2018 | Tomomatsu | H01L 29/2003 |
| 2006/0214221 A1 | 9/2006 | Challa et al. | |
| 2014/0159050 A1 | 6/2014 | Yoon et al. | |
| 2016/0268410 A1* | 9/2016 | Onizawa | H01L 29/42376 |

FOREIGN PATENT DOCUMENTS

| | | |
|---|---|---|
| CN | 103137476 A | 6/2013 |
| CN | 103178106 A | 6/2013 |
| CN | 105977250 A | 9/2016 |

OTHER PUBLICATIONS

CN Office Action of its corresponding CN application No. 201810449892.1 dated Apr. 17, 2020; pp. 1-5.

* cited by examiner

*Primary Examiner* — Suberr L Chi
(74) *Attorney, Agent, or Firm* — Muncy, Geissler, Olds & Lowe, P.C.

(57) ABSTRACT

A semiconductor structure is provided, which includes a semiconductor device, a first conductive layer, and a gate runner. The semiconductor device includes an upper surface, a gate terminal, a source terminal, and a drain terminal. The first conductive layer is deposited on the upper surface and coupled to the source terminal. The gate runner is overlapped with the first conductive layer and coupled to the gate terminal. The gate runner and the first conductive layer are configured to contribute a parasitic capacitance between the gate terminal and the source terminal.

17 Claims, 7 Drawing Sheets

ENCLOSED GATE RUNNER FOR ELIMINATING MILLER TURN-ON

CROSS REFERENCE TO RELATED APPLICATIONS

This Application is a Continuation of pending U.S. patent application Ser. No. 15/655,241 filed Jul. 20, 2017 and entitled "enclosed gate runner for eliminating Miller turn-on", the entirety of which is incorporated by reference herein.

BACKGROUND OF THE INVENTION

Field of the Invention

The disclosure relates generally to a semiconductor structure for eliminating the Miller turn-on, and more particularly it relates to an enclosed gate runner for eliminating the Miller turn-on.

Description of the Related Art

Figure 1:
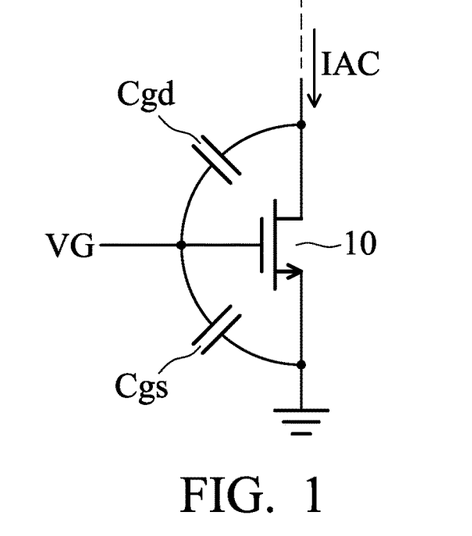
FIG. 1 illustrates a transistor with gate-to-drain capacitance and gate-to-source capacitance.

One of the most common problems faced in a majority of industrial switch applications is the parasitic turn-on effect caused by parasitic Miller capacitance. FIG. 1 illustrates a transistor with gate-to-drain capacitance and gate-to-source capacitance. As shown in FIG. 1, the transistor 10 includes a gate-to-drain capacitance Cgd and a gate-to-source capacitance Cgs.

When the transistor 10 is turned OFF and receives an AC current IAC, the AC current IAC flows through the gate-to-drain capacitance Cgd and the gate-to-source capacitance Cgs such that the gate voltage VG is raised. Once the gate voltage VG is high enough to unexpectedly turn on the transistor 10, extra power loss and malfunctions are introduced, which is called Miller turn-on. Therefore, a semiconductor structure for eliminating the Miller turn-on is urgently required.

BRIEF SUMMARY OF THE INVENTION

In an embodiment, a semiconductor structure comprises a semiconductor device, a first conductive layer, and a gate runner. The semiconductor device comprises an upper surface, a gate terminal, a source terminal, and a drain terminal. The first conductive layer is deposited on the upper surface and coupled to the source terminal. The gate runner is overlapped with the first conductive layer and coupled to the gate terminal. The gate runner and the first conductive layer are configured to contribute a parasitic capacitance between the gate terminal and the source terminal.

According to an embodiment of the invention, first conductive layer is a field plate.

According to an embodiment of the invention, the gate runner is deposited on the first conductive layer.

According to an embodiment of the invention, the semiconductor structure further comprises a first insulating layer and a second insulating layer. The first insulating layer is deposited between the first conductive layer and the upper surface. The second insulating layer is deposited between the first conductive layer and the gate runner.

According to another embodiment of the invention, the first conductive layer is divided into a first part and a second part, wherein the gate runner is overlapped with the first part and the second part.

According to yet another embodiment of the invention, the first conductive layer is staggered with the gate runner.

According to yet another embodiment of the invention, the semiconductor structure further comprises a second conductive layer and a third insulating layer. The second conductive layer is deposited on the gate runner and the first conductive layer and coupled to the source terminal. The second conductive layer and the gate runner contribute the parasitic capacitance. The third insulating layer is deposited between the gate runner and the second conductive layer.

According to an embodiment of the invention, the second conductive layer is a field plate.

According to yet another embodiment of the invention, the semiconductor structure further comprises a metal layer and a fourth insulating layer. The metal layer is deposited on the second conductive layer and coupled to the gate terminal. The second conductive layer and the metal layer contribute the parasitic capacitance. The fourth insulating layer is deposited between the metal layer and the second conductive layer.

According to yet another embodiment of the invention, the second conductive layer has an opening, wherein the gate runner is electrically coupled to the metal layer through the opening.

According to yet another embodiment of the invention, the first conductive layer is divided into a first part and a second part. The gate runner is overlapped with the first part and the second part.

According to yet another embodiment of the invention, the gate runner is deposited between the first conductive layer and the upper surface.

According to yet another embodiment of the invention, the semiconductor structure further comprises a first insulating layer and a second insulating layer. The first insulating layer is deposited between the gate runner and the upper surface. The second insulating layer is deposited between the first conductive layer and the gate runner.

In an embodiment, a semiconductor structure comprises a III-V device, a first conductive layer, and a gate runner. The III-V device comprises an upper surface, a gate terminal, a source terminal, and a drain terminal. The first conductive layer is deposited on the upper surface and coupled to the source terminal. The gate runner is overlapped with the first conductive layer and coupled to the gate terminal. The gate runner and the first conductive layer contribute a parasitic capacitance between the gate terminal and the source terminal.

According to an embodiment of the invention, the first conductive layer is a field plate.

According to an embodiment of the invention, the gate runner is deposited on the first conductive layer.

According to an embodiment of the invention, the semiconductor structure further comprises a first insulating layer and a second insulating layer. The first insulating layer is deposited between the first conductive layer and the upper surface. The second insulating layer is deposited between the first conductive layer and the gate runner.

According to another embodiment of the invention, the first conductive layer is divided into a first part and a second part, wherein the gate runner is overlapped with the first part and the second part.

According to yet another embodiment of the invention, the first conductive layer is staggered with the gate runner.

According to yet another embodiment of the invention, the semiconductor structure further comprises a second conductive layer and a third insulating layer. The second conductive layer is deposited on the gate runner and the first conductive layer and coupled to the source terminal. The second conductive layer and the gate runner contribute the parasitic capacitance. The third insulating layer is deposited between the gate runner and the second conductive layer.

According to yet another embodiment of the invention, the semiconductor structure further comprises a metal layer and a fourth insulating layer. The metal layer is deposited on the second conductive layer and coupled to the gate terminal. The second conductive layer and the metal layer contribute the parasitic capacitance. The fourth insulating layer is deposited between the metal layer and the second conductive layer.

According to yet another embodiment of the invention, the second conductive layer has an opening, wherein the gate runner is electrically coupled to the metal layer through the opening.

According to yet another embodiment of the invention, the first conductive layer is divided into a first part and a second part. The gate runner is overlapped with the first part and the second part.

According to yet another embodiment of the invention, the gate runner is deposited between the first conductive layer and the upper surface.

According to yet another embodiment of the invention, the semiconductor structure further comprises a first insulating layer and a second insulating layer. The first insulating layer is deposited between the gate runner and the upper surface. The second insulating layer is deposited between the first conductive layer and the gate runner.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

This description is made for the purpose of illustrating the general principles of the invention and should not be taken in a limiting sense. In addition, the present disclosure may repeat reference numerals and/or letters in the various examples. This repetition is for the purpose of simplicity and clarity and does not in itself dictate a relationship between the various embodiments and/or configurations discussed. The scope of the invention is best determined by reference to the appended claims.

It is understood that the following disclosure provides many different embodiments, or examples, for implementing different features of the application. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact.

Referring to FIG. 1, when the transistor 10 is in the OFF state and receives the AC current IAC, the gate voltage VG is proportional to a capacitance ratio which is:

$$\frac{Cgd}{Cgd + Cgs}.$$

In order to eliminate the Miller turn-on, the gate-to-source capacitance Cgs should be increased to minimize the capacitance ratio, such that the gate voltage VG is low enough to keep the transistor 10 being in the OFF state.

Figure 2:
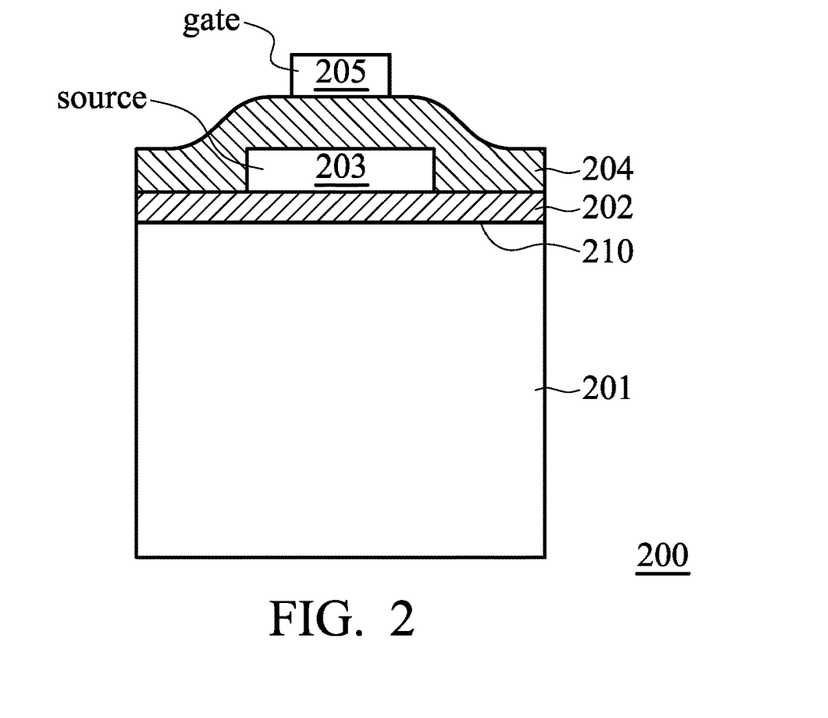
FIG. 2 is a cross-view diagram of a semiconductor structure in accordance with an embodiment of the invention.

FIG. 2 is a cross-view diagram of a semiconductor structure in accordance with an embodiment of the invention. As shown in FIG. 2, the semiconductor structure 200 includes a semiconductor device 201, a first insulating layer 202, a first conductive layer 203, a second insulating plate 204, and a gate runner 205. The semiconductor device 201 includes an upper surface 210 and at least one transistor including a gate terminal (not shown in FIG. 2), a source terminal (not shown in FIG. 2), and a drain terminal (not shown in FIG. 2). The gate terminal, the source terminal, and the drain terminal are discussed in the following paragraphs.

The first insulating layer 202 is deposited on the upper surface 210. The first conductive layer 203 is deposited on the first insulating layer 202, which is coupled to the source terminal of the semiconductor 201. The second insulating layer 204 is then deposited on the first conductive layer 203. The gate runner 205 is stacked on the second insulating layer 204 and overlapped with the first conductive layer 203, in which the gate runner 205 is coupled to the gate terminal of the semiconductor device 201.

According to an embodiment of the invention, the first conductive layer 203 and the gate runner 205 are configured to contribute a parasitic capacitance between the gate terminal and the source terminal, such that the gate-to-source capacitance is increased and the Miller turn-on is thus eliminated. According to an embodiment of the invention, the first conductive layer 203 is a field plate. According to an embodiment of the invention, the field plate is configured to enhance the performance of transistors such as electric field dissipation.

Figure 3:
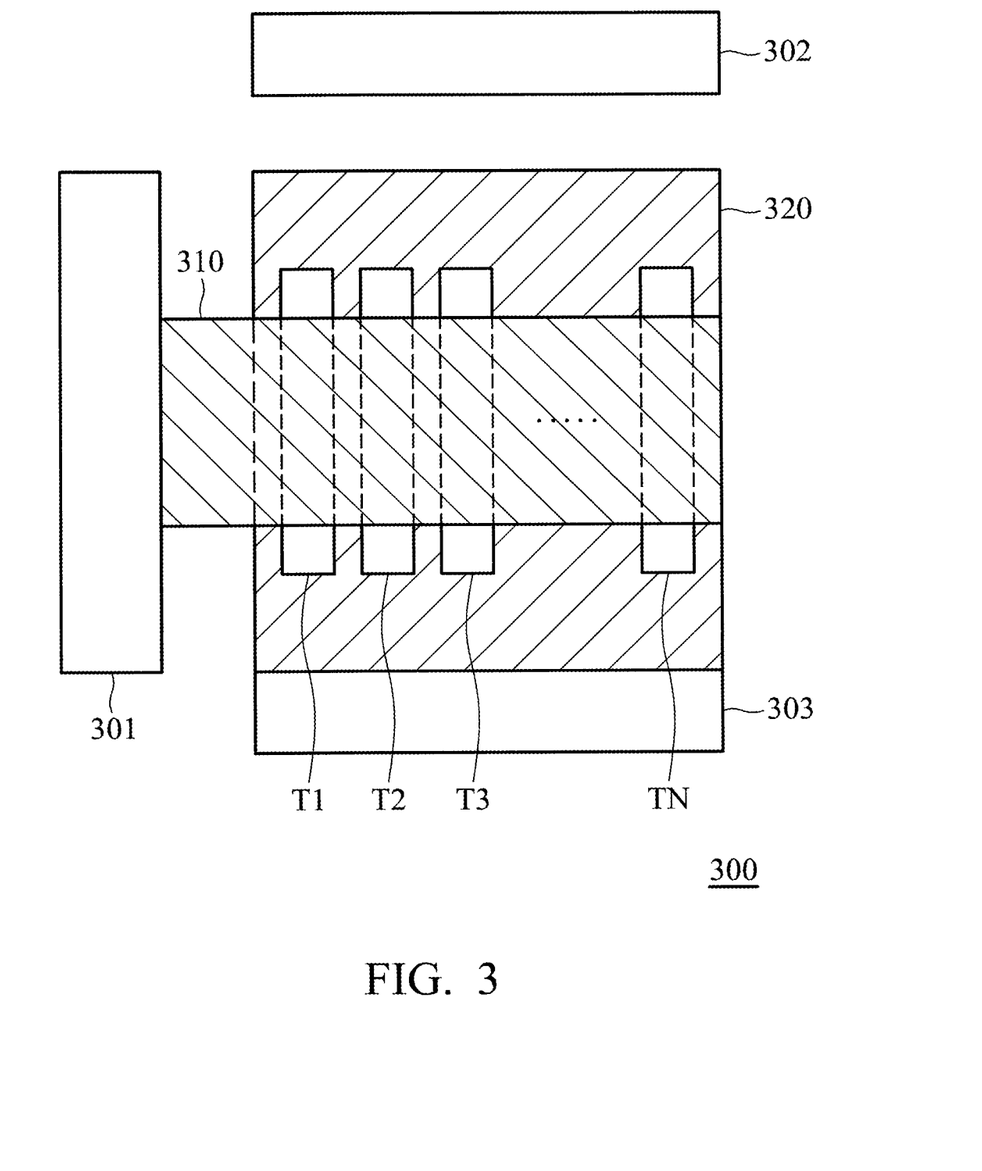
FIG. 3 is a top-view layout diagram of the semiconductor structure in FIG. 2 in accordance with an embodiment of the invention.

FIG. 3 is a top-view layout diagram of the semiconductor structure in FIG. 2 in accordance with an embodiment of the invention. As shown in FIG. 3, the semiconductor structure 300 includes a first transistor T1, a second transistor T2, a third transistor T3, . . . , an N-th transistor TN, a gate terminal 301, a drain terminal 302, a source terminal 303, a gate runner 310, and a first conductive layer 320.

The first transistor T1, the second transistor T2, the third transistor T3, . . . , and the N-th transistor TN respectively correspond to the semiconductor device 201 in FIG. 2, each of which includes a gate terminal, a source terminal, and a drain terminal. The gate terminals, the source terminals, and the drain terminals of the first transistor T1, the second transistor T2, the third transistor T3, . . . , and the N-th transistor TN are respectively coupled to the gate terminal 301, the drain terminal 302, and the source terminal 303.

According to an embodiment of the invention, the gate runner 310, which corresponds to the gate runner 205 in FIG. 2, is coupled to the gate terminal 301 and goes across each of the first transistor T1, the second transistor T2, the third transistor T3, . . . , and the N-th transistor TN. The first conductive layer 320, which corresponds to the first conductive layer 203 in FIG. 2, is coupled to the source terminal 303 and covers the first transistor T1, the second transistor T2, the third transistor T3, . . . , and the N-th transistor TN.

The gate runner 310 in FIG. 3 is merely illustrated, which is not intended to limit thereto. According to other embodiments of the invention, the gate runner 310 may not go across the first transistor T1, the second transistor T2, the third transistor T3, . . . , and the N-th transistor TN, so that there is a spacing between the gate runner 310 and each of the first transistor T1, the second transistor T2, the third transistor T3, . . . , and the N-th transistor TN.

According to an embodiment of the invention, each of the first transistor T1, each of the second transistor T2, the third transistor T3, . . . , and the N-th transistor TN may be a III-V transistor. According to another embodiment of the invention, each of the second transistor T2, the third transistor T3, . . . , and the N-th transistor TN may be a GaN HEMT. According to yet another embodiment of the invention, each of the second transistor T2, the third transistor T3, . . . , and the N-th transistor TN may be an enhancement mode HEMT.

Figure 4:
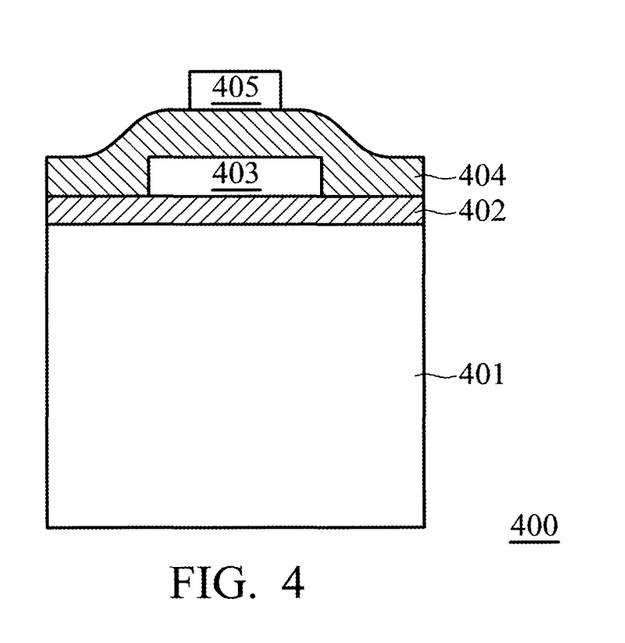
FIG. 4 is a cross-view diagram of a semiconductor structure in accordance with another embodiment of the invention.

FIG. 4 is a cross-view diagram of a semiconductor structure in accordance with another embodiment of the invention. As shown in FIG. 4, the semiconductor structure 400 includes a semiconductor device 401, a first insulating layer 402, a gate runner 403, a second insulating plate 404, and a first conductive layer 405.

Comparing FIG. 4 with FIG. 2, the semiconductor device 401, the first insulating layer 402, and the second insulating plate 404 respectively correspond to the semiconductor device 201, the first insulating layer 202, and the second insulating plate 204. In addition, the first conductive layer 405 is stacked on the gate runner 403. According to an embodiment of the invention, the first conductive layer 405 is a field plate. According to an embodiment of the invention, the field plate is configured to enhance the performance of transistors such as electric field dissipation.

Figure 5:
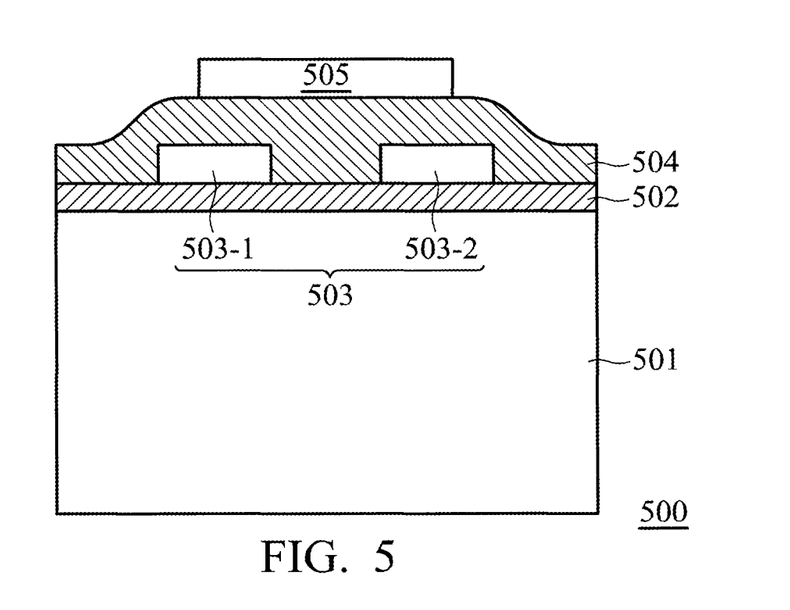
FIG. 5 is a cross-view diagram of a semiconductor structure in accordance with yet another embodiment of the invention.

FIG. 5 is a cross-view diagram of a semiconductor structure in accordance with yet another embodiment of the invention. As shown in FIG. 5, the semiconductor structure 500 includes a semiconductor device 501, a first insulating layer 502, a first part 503-1 and a second part 503-2 of the first conductive layer 503, a second insulating plate 504, and a gate runner 505.

Comparing FIG. 5 with FIG. 2, the semiconductor device 501, the first insulating layer 502, the first conductive layer 503, the second insulating plate 504, and the gate runner 505 respectively correspond to the semiconductor device 201, the first insulating layer 202, the first conductive layer 203, the second insulating plate 204, and the gate runner 205, except for the first conductive layer 503 being divided into the first part 503-1 and the second part 503-2. In addition, the gate runner 505 is overlapped with both the first part 503-1 and the second part 503-2.

Figure 6:
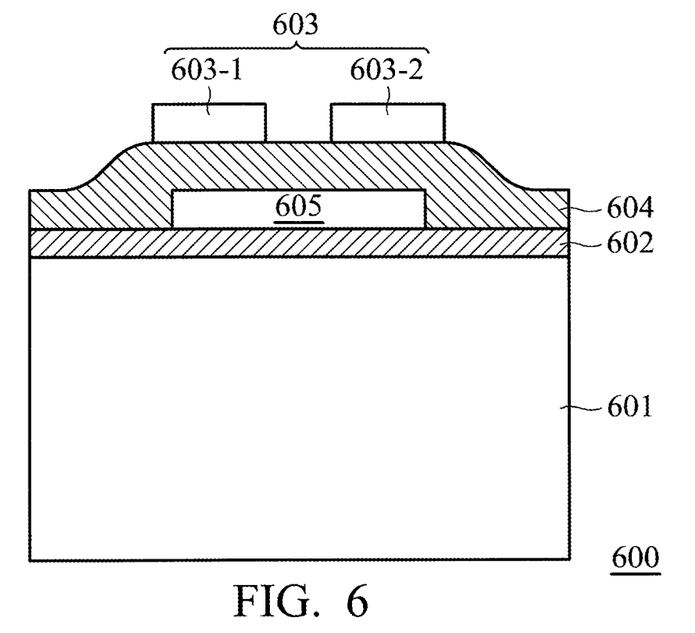
FIG. 6 is a cross-view diagram of a semiconductor structure in accordance with yet another embodiment of the invention.

FIG. 6 is a cross-view diagram of a semiconductor structure in accordance with yet another embodiment of the invention. As shown in FIG. 6, the semiconductor structure 600 includes a semiconductor device 601, a first insulating layer 602, a first part 603-1 and a second part 603-2 of a first conductive layer 603, a second insulating plate 604, and a gate runner 605.

Comparing FIG. 6 with FIG. 5, the semiconductor device 601, the first insulating layer 602, the first conductive layer 603, the second insulating plate 604, and the gate runner 605 respectively correspond to the semiconductor device 501, the first insulating layer 502, the first conductive layer 503, the second insulating plate 504, and the gate runner 505, except for the gate runner 605 being placed below the first conductive layer 603 which is divided into the first part 603-1 and the second part 603-2. In addition, the first part 603-1 and the second part 603-2 both are overlapped with the gate runner 605.

Figure 7:
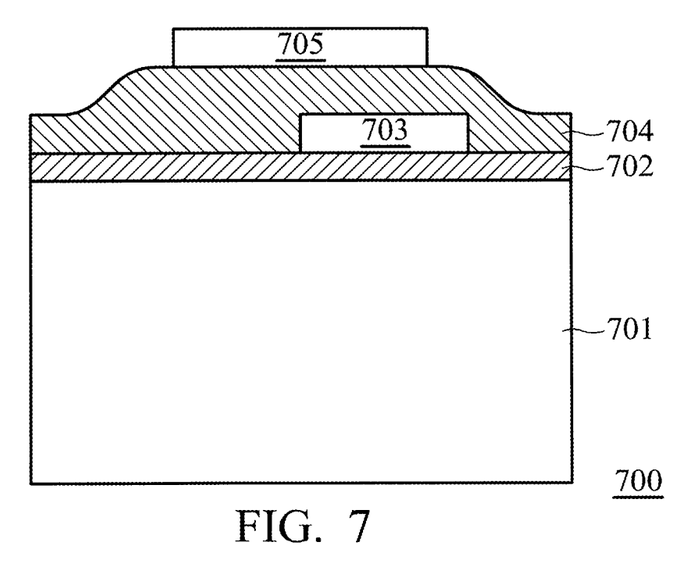
FIG. 7 is a cross-view diagram of a semiconductor structure in accordance with yet another embodiment of the invention.

FIG. 7 is a cross-view diagram of a semiconductor structure in accordance with yet another embodiment of the invention. As shown in FIG. 7, the semiconductor structure 700 includes a semiconductor device 701, a first insulating layer 702, a first conductive layer 703, a second insulating plate 704, and a gate runner 705.

Comparing FIG. 7 with FIG. 2, the semiconductor device 701, the first insulating layer 702, the first conductive layer 703, the second insulating plate 704, and the gate runner 705 respectively correspond to the semiconductor device 201, the first insulating layer 202, the first conductive layer 203, the second insulating plate 204, and the gate runner 205, except for the first conductive layer 703 being staggered and still overlapped with the gate runner 705.

Figure 8:
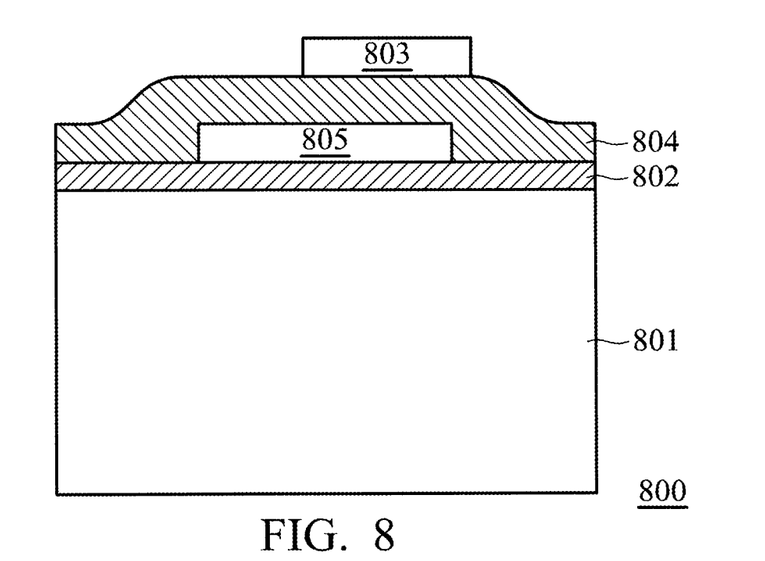
FIG. 8 is a cross-view diagram of a semiconductor structure in accordance with yet another embodiment of the invention.

FIG. 8 is a cross-view diagram of a semiconductor structure in accordance with yet another embodiment of the invention. As shown in FIG. 8, the semiconductor structure 800 includes a semiconductor device 801, a first insulating layer 802, a first conductive layer 803, a second insulating plate 804, and a gate runner 805.

Comparing FIG. 8 with FIG. 2, the semiconductor device 801, the first insulating layer 802, the first conductive layer 803, the second insulating plate 804, and the gate runner 805 respectively correspond to the semiconductor device 201, the first insulating layer 202, the first conductive layer 203, the second insulating plate 204, and the gate runner 205, except for the gate runner 805 being staggered and still overlapped with the first conductive layer 803.

Figure 9:
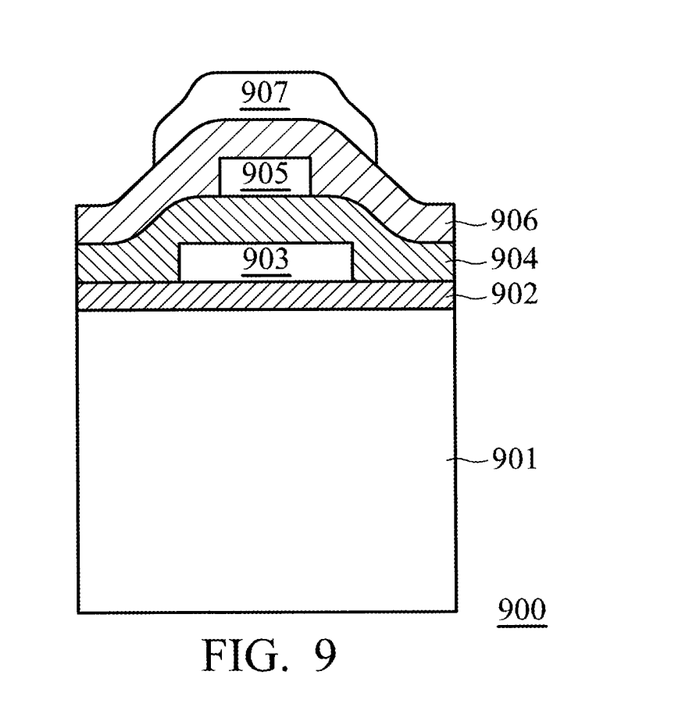
FIG. 9 is a cross-view diagram of a semiconductor structure in accordance with yet another embodiment of the invention.

FIG. 9 is a cross-view diagram of a semiconductor structure in accordance with yet another embodiment of the invention. As shown in FIG. 9, the semiconductor structure 900 includes a semiconductor device 901, a first insulating layer 902, a first conductive layer 903, a second insulating plate 904, and a gate runner 905, which respectively correspond to the semiconductor device 201, the first insulating layer 202, the first conductive layer 203, the second insulating plate 204, and the gate runner 205.

The semiconductor structure 900 further includes a third insulating layer 906 and a second conductive layer 907. The second conductive layer 907 is coupled to the source terminal of the semiconductor device 901, such that the gate-to-source capacitance is further increased by the gate runner 905 and the second conductive layer 907. According to an embodiment of the invention, the second conductive layer 907 is a field plate. Since the third insulating layer 906 is not smooth, it looks like the second conductive layer 907 encloses the gate runner 905.

Figure 10:
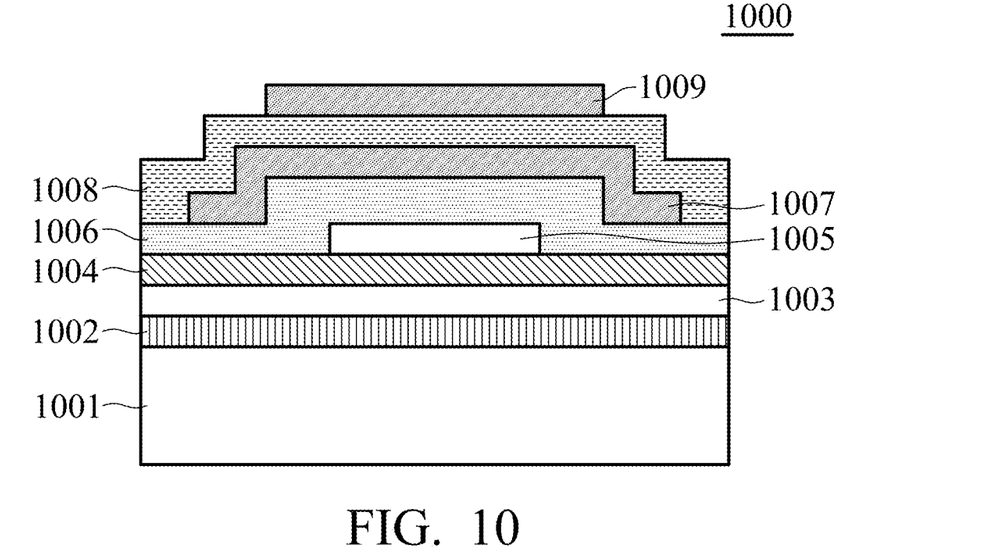
FIG. 10 shows a simplified cross-view diagram of a semiconductor structure in accordance with yet another embodiment of the invention.

FIG. 10 shows a simplified cross-view diagram of a semiconductor structure in accordance with yet another embodiment of the invention. As shown in FIG. 10, the semiconductor structure 1000 includes a first conductive layer 1003, a gate runner 1005, a second conductive layer 1007, and a metal layer 1009 coupled to the gate terminal of the semiconductor device, in which the first conductive layer 1003, the gate runner 1005, and the second conductive layer 1007 respectively correspond to the first conductive layer 903, the gate runner 905, and the second conductive layer 907 in FIG. 9.

For the simplicity of illustration, all the insulating layers and semiconductor device are omitted herein, even though there is a fourth insulating layer deposited between the second conductive layer 1007 and the metal layer 1009. As shown in FIG. 10, the gate runner 1005 is enclosed by the first conductive layer 1003 and the second conductive layer 1007. The metal layer 1009 is further incorporated to contribute the parasitic capacitance between the gate terminal and the source terminal, such that the Miller turn-on is further eliminated.

According to another embodiment of the invention, the first conductive layer 1003 may be divided into two parts and the gate runner 1005 is still overlapped with each part of the first conductive layer 1003.

Figure 11:
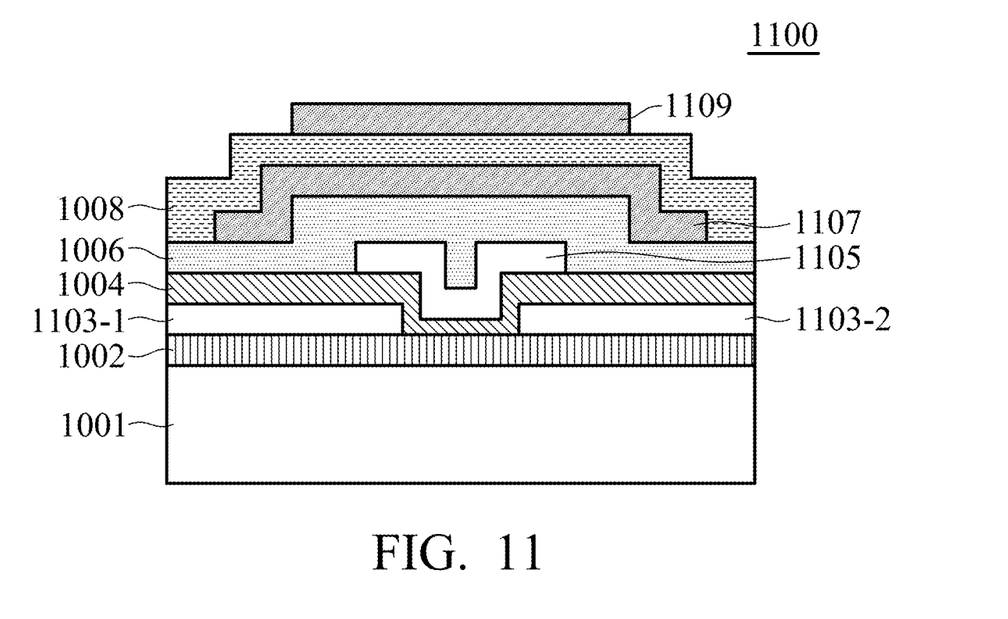
FIG. 11 shows a simplified cross-view diagram of a semiconductor structure in accordance with yet another embodiment of the invention.

FIG. 11 shows a simplified cross-view diagram of a semiconductor structure in accordance with yet another embodiment of the invention. As shown in FIG. 11, the semiconductor structure 1100 includes a first conductive layer 1103, a gate runner 1105, a second conductive layer 1107, and a metal layer 1109 coupled to the gate terminal of the semiconductor device. Comparing FIG. 11 with FIG. 10, the first conductive layer 1103 is divided into a first part 1103-1 and a second part 1103-2.

Figure 12:
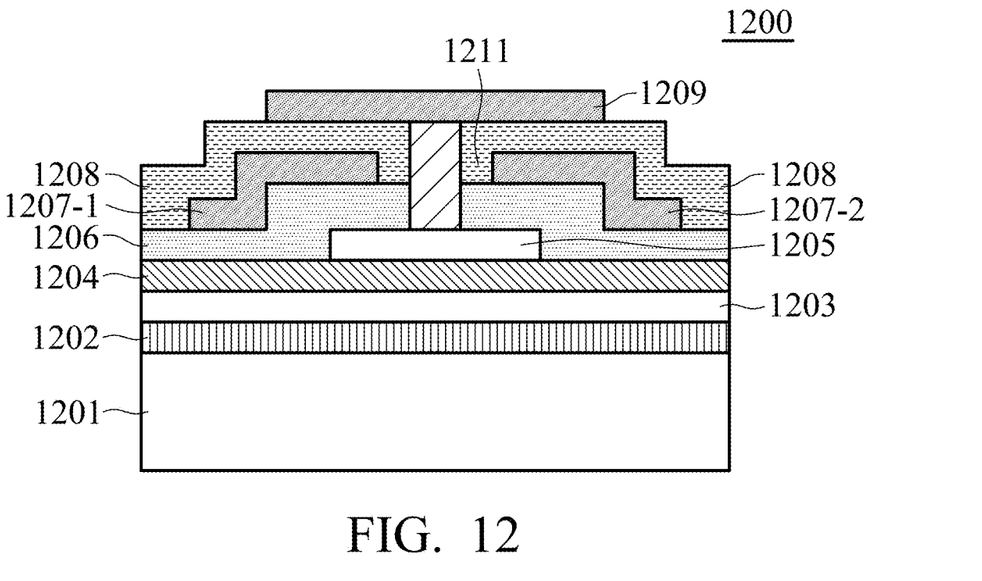
FIG. 12 shows a simplified cross-view diagram of a semiconductor structure in accordance with yet another embodiment of the invention.

FIG. 12 shows a simplified cross-view diagram of a semiconductor structure in accordance with yet another embodiment of the invention. As shown in FIG. 12, the semiconductor structure 1200 includes a first conductive layer 1203, a gate runner 1205, a first part 1207-1 of the second conductive layer 1207, a second part 1207-2 of the second conductive layer 1207, and a metal layer 1209. The first conductive layer 1203, the gate runner 1205, the second conductive layer 1207, and the metal layer 1209 respectively correspond to the first conductive layer 1003, the gate runner 1005, the second conductive layer 1007, and the metal layer 1009 in FIG. 10.

The semiconductor structure 1200 further includes a first insulating layer 1202, a second insulating layer 1204, a third insulating layer 1206, and a fourth insulating layer 1208. The first insulating layer 1202 is deposited between the upper surface 1210 of the semiconductor device 1201 and the first conductive layer 1203. The second insulating layer 1204 is deposited between the first conductive layer 1203 and the gate runner 1205. The third insulating layer 1206 is deposited between the gate runner 1205 and the second conductive layer 1207. The fourth insulating layer 1208 is deposited between the second conductive layer 1207 and the metal layer 1209. There is an opening 1211 between the first part 1207-1 and the second part 1207-2, and the metal layer 1209 is electrically coupled to the gate runner 1205 through the opening 1211. According to an embodiment of the invention, the metal layer 1209 is electrically coupled to the gate runner 1205 by a via. According to another embodment of the invention, the metal layer 1209 is electrically coupled to the gate runner 1205 by filling the opening 1211 with metal.

According to an embodiment of the invention, the first conductive layer 1203 may be divided into two parts, and the gate runner 1205 is still overlapped with each part of the first conductive layer 1203.

Figure 13:
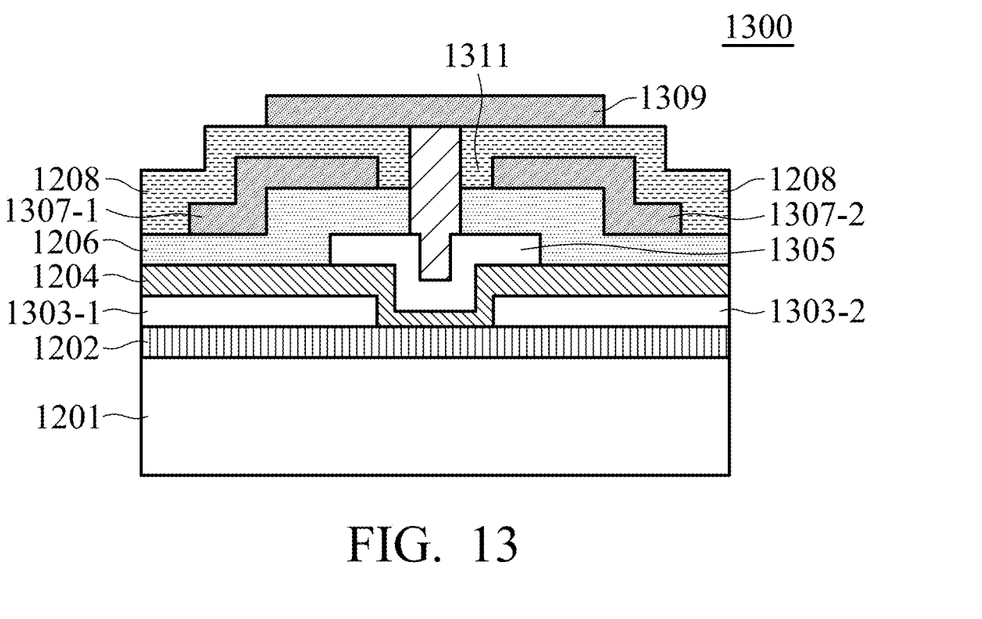
FIG. 13 shows a simplified cross-view diagram of a semiconductor structure in accordance with yet another embodiment of the invention.

FIG. 13 shows a simplified cross-view diagram of a semiconductor structure in accordance with yet another embodiment of the invention. As shown in FIG. 13, the semiconductor structure 1300 includes a first conductive layer 1303, a gate runner 1305, a first part 1307-1 of the second conductive layer 1307, a second part 1307-2 of the second conductive layer 1307, and a metal layer 1309. Comparing FIG. 13 with FIG. 12, the first conductive layer 1203 is divided into a first part 1203-1 and a second part 1203-2.

While the invention has been described by way of example and in terms of preferred embodiment, it should be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. A semiconductor structure, comprising:
   a semiconductor device, comprising an upper surface, a gate terminal, a source terminal, and a drain terminal;
   a first conductive layer, deposited on the upper surface and coupled to the source terminal; and
   a gate runner, overlapped with the first conductive layer and coupled to the gate terminal, wherein the gate runner and the first conductive layer are configured to contribute a parasitic capacitance between the gate terminal and the source terminal in order to minimize a Miller turn-on effect, wherein the first conductive layer is a field plate, wherein the gate runner is deposited on the first conductive layer so that the first conductive layer is deposited between the gate runner and the upper surface.

2. The semiconductor structure of claim 1, further comprising:
   a first insulating layer, deposited between the first conductive layer and the upper surface; and
   a second insulating layer, deposited between the first conductive layer and the gate runner.

3. The semiconductor structure of claim 1, wherein the first conductive layer is divided into a first part and a second part, wherein the gate runner is overlapped with the first part and the second part.

4. The semiconductor structure of claim 1, wherein the first conductive layer is staggered with the gate runner.

5. The semiconductor structure of claim 1, further comprising: a second conductive layer, deposited on the gate runner and the first conductive layer and coupled to the source terminal, wherein the second conductive layer and the gate runner contribute the parasitic capacitance; and a third insulating layer, deposited between the gate runner and the second conductive layer.

6. The semiconductor structure of claim 5, wherein the second conductive layer is a field plate.

7. The semiconductor structure of claim 5, further comprising:
   a metal layer, deposited on the second conductive layer and coupled to the gate terminal, wherein the second conductive layer and the metal layer contribute the parasitic capacitance; and
   a fourth insulating layer, deposited between the metal layer and the second conductive layer.

8. The semiconductor structure of claim 7, wherein the second conductive layer has an opening, wherein the gate runner is electrically coupled to the metal layer through the opening.

9. A semiconductor structure, comprising:
   a III-V device, comprising an upper surface, a gate terminal, a source terminal, and a drain terminal;
   a first conductive layer, deposited on the upper surface and coupled to the source terminal; and
   a gate runner, overlapped with the first conductive layer and coupled to the gate terminal, wherein the gate runner and the first conductive layer contribute a parasitic capacitance between the gate terminal and the source terminal in order to minimize a-Miller turn-on effect, wherein the first conductive layer is a field plate, wherein the gate runner is deposited on the first conductive layer so that the first conductive layer is deposited between the gate runner and the upper surface.

10. The semiconductor structure of claim 9, further comprising:
    a first insulating layer, deposited between the first conductive layer and the upper surface; and
    a second insulating layer, deposited between the first conductive layer and the gate runner.

11. The semiconductor structure of claim 9, wherein the first conductive layer is staggered with the gate runner.

12. The semiconductor structure of claim 9, further comprising: a second conductive layer, deposited on the gate runner and the first conductive layer and coupled to the source terminal, wherein the second conductive layer and the gate runner contribute the parasitic capacitance; and a third insulating layer, deposited between the gate runner and the second conductive layer.

13. The semiconductor structure of claim 12, wherein the second conductive layer is a field plate.

14. The semiconductor structure of claim 12, further comprising:
    a metal layer, deposited on the second conductive layer and coupled to the gate terminal, wherein the second conductive layer and the metal layer contribute the parasitic capacitance; and
    a fourth insulating layer, deposited between the metal layer and the second conductive layer.

15. The semiconductor structure of claim 14, wherein the second conductive layer has an opening, wherein the gate runner is electrically coupled to the metal layer through the opening.

16. The semiconductor structure of claim 9, wherein the III-V device is a GaN HEMT.

17. The semiconductor structure of claim 9, wherein the III-V device is an enhancement mode HEMT.

\* \* \* \* \*